US010524366B2

(12) United States Patent
Tannehill et al.

(10) Patent No.: US 10,524,366 B2
(45) Date of Patent: Dec. 31, 2019

(54) METHODS OF MANUFACTURING PRINTED CIRCUIT BOARDS

(71) Applicant: Printed Circuits, Inc., Minneapolis, MN (US)

(72) Inventors: Kenneth Richard Tannehill, Eden Prairie, MN (US); Steven Craig Hanson, Bloomington, MN (US)

(73) Assignee: Printed Circuits, LLC, Bloomington, MN (US)

( * ) Notice: Subject to any disclaimer, the term of this patent is extended or adjusted under 35 U.S.C. 154(b) by 0 days.

(21) Appl. No.: 15/743,837

(22) PCT Filed: Jul. 14, 2016

(86) PCT No.: PCT/US2016/042359
§ 371 (c)(1),
(2) Date: Jan. 11, 2018

(87) PCT Pub. No.: WO2017/011703
PCT Pub. Date: Jan. 19, 2017

(65) Prior Publication Data
US 2018/0206347 A1    Jul. 19, 2018

Related U.S. Application Data

(60) Provisional application No. 62/192,800, filed on Jul. 15, 2015.

(51) Int. Cl.
*H05K 3/42* (2006.01)
*H01B 1/22* (2006.01)
(Continued)

(52) U.S. Cl.
CPC ............... *H05K 3/429* (2013.01); *H01B 1/22* (2013.01); *H05K 1/0281* (2013.01);
(Continued)

(58) Field of Classification Search
CPC ....... H01L 21/48; H01L 21/4857; H05K 1/11; H05K 1/111; H05K 1/144; H05K 1/181;
(Continued)

(56) References Cited

U.S. PATENT DOCUMENTS 5,504,277 A    4/1996 Danner
6,485,827 B2   11/2002 Griffith et al.
(Continued)

OTHER PUBLICATIONS

International Patent Application No. PCT/US16/42359, Notification of Transmittal of the International Search Report and The Written Opinion of the International Searching Authority, of the Declaration, dated Sep. 26, 2016, 13 pages.
(Continued)

*Primary Examiner* — Carl J Arbes
(74) *Attorney, Agent, or Firm* — Morgan, Lewis & Bockius LLP

(57) ABSTRACT

A polymer film is applied onto a surface of a laminated printed circuit board subassembly having vias. Holes are created in the polymer film to access the vias while the polymer film remains covering adjacent areas. The polymer film with holes allows placement of hole-fill paste in the vias while preventing unwanted hole-fill paste placement or migration to adjacent areas. After filling the vias with hole-fill paste, the hole-fill paste is preferably at least partially hardened or cured, and the polymer film is preferably removed, facilitating further assembly of a printed circuit board without unwanted hole-fill paste in other areas which could be difficult to remove, The invention includes improved processes for fabricating printed circuit boards, and is particularly useful for irregular circuit boards and rigid flex circuit boards. The invention also includes covered laminated printed circuit board subassemblies, covered with a removable polymer film.

32 Claims, 10 Drawing Sheets

(51) Int. Cl.
  *H05K 1/02* (2006.01)
  *H05K 3/46* (2006.01)
(52) U.S. Cl.
  CPC . *H05K 3/4691* (2013.01); *H05K 2201/09063* (2013.01); *H05K 2201/09518* (2013.01); *H05K 2201/09563* (2013.01)
(58) Field of Classification Search
  CPC .... H05K 1/0281; H05K 3/429; H05K 3/4691; H05K 2201/09063; H05K 2201/09518; H05K 2201/09563; H01B 1/22
  See application file for complete search history.

(56) References Cited

U.S. PATENT DOCUMENTS

| | | | |
|---|---|---|---|
| 9,545,017 B2 * | 1/2017 | Hunrath | H05K 3/4614 |
| 2001/0009273 A1 | 7/2001 | John | |
| 2002/0040522 A1 | 4/2002 | Ohya et al. | |
| 2008/0296052 A1 * | 12/2008 | Inagaki | H01L 23/49816 |
| | | | 174/260 |
| 2009/0056987 A1 * | 3/2009 | Nomiya | H01L 21/4857 |
| | | | 174/255 |
| 2011/0073358 A1 * | 3/2011 | Hayashi | H05K 3/4602 |
| | | | 174/258 |
| 2011/0099806 A1 * | 5/2011 | Koyama | H05K 3/4614 |
| | | | 29/849 |
| 2013/0043067 A1 * | 2/2013 | Hayashi | B32B 5/022 |
| | | | 174/258 |
| 2013/0153279 A1 * | 6/2013 | Hayashi | H05K 3/4673 |
| | | | 174/264 |
| 2014/0231126 A1 * | 8/2014 | Hunrath | H05K 3/4614 |
| | | | 174/264 |
| 2015/0060124 A1 * | 3/2015 | Terui | H05K 1/141 |
| | | | 174/261 |
| 2015/0060127 A1 * | 3/2015 | Terui | H05K 1/141 |
| | | | 174/263 |

OTHER PUBLICATIONS

First Office Action for corresponding Chinese Patent Application No. 201680051216.8 dated Mar. 13, 2019, 12 pages.

\* cited by examiner

METHODS OF MANUFACTURING PRINTED CIRCUIT BOARDS

CROSS-REFERENCE TO RELATED APPLICATIONS

This application is a U.S. National Phase Application under 35 U.S.C. 371 of International Application No. PCT/US2016/042359 filed Jul. 14, 2016, which claims the benefit of U.S. Provisional Patent Application No. 62/192,800 filed Jul. 15, 2015 entitled "Methods of Manufacturing printed Circuit Boards", all of which are incorporated by reference herein in their entireties.

BACKGROUND

Field of the Invention

The present invention pertains generally to rigid, flexible, and rigid flex printed electronic circuit boards (referred to herein as "printed circuit boards"), particularly, laminated assemblies of printed circuit boards, having vias and/or through holes and methods of manufacturing the same. More particularly, the invention relates to methods of protecting laminated printed circuit boards during hole-fill operations, methods-of manufacturing products according to such methods, and products made according to such methods.

Description of the Prior Art

In the art of fabricating printed circuit boards, such circuits are often laminations with a plurality of circuit layers. To connect selected portions of the circuits on two or more layers, holes can be created in each of these layers. When the layers are aligned and processed to form a laminated structure, the aligned holes are plated with conductor and/or filled with conductive paste, so that the holes provide an electrical pathway or via to electrically connect the layers.

A via used for electrical communication between conductive path layers of the printed circuit board typically has conductive pads in corresponding positions on a plurality of layers of the printed circuit board that are connected by a hole through the board. The hole is typically made conductive by electroplating. Vias may extend all the way through the printed circuit board, with a top surface opening in the top surface of the printed circuit board, and an adjacent pad on the top surface, and bottom surface opening in the bottom surface of the printed circuit board, and an adjacent pad on the bottom surface, for example. Alternatively, vias can extend through some, but not all, of the layers of the printed circuit board. For example, some vias that extend through some of the layers of the printed circuit board, but are exposed only on the top surface or the bottom surface of the printed circuit board, but not both, are called blind vias. Vias which extend through some of the layers of the printed circuit board, but are not exposed on either the, top surface or the bottom surface of the printed circuit board, are called buried vias. Such vias typically comprise a barrel portion (i.e., a conductive tube that fills a drilled hole), pads that connect each end of the barrel to a component, a layer, or a trace, and often one or more antipads that provide clearance gaps between the barrel and a metal layer so that the layer or trace is not connected. A via may be proximate the edge of the board so that it is cut in half when the board is separated. This is known as a castellated hole and is used for a variety of reasons, including allowing one printed circuit board to be soldered to another in a stack. Some vias are used for heat transfer and are called thermal vias and are typically used to carry heat away from power devices and are typically used in arrays of multiple vias.

In some portions of the laminated structure, surface-mounted electrical components can be attached. To facilitate electrical communication with the surface-mounted electrical components, the surface of the laminated structure can have conductive solder pads for placement of the surface-mounted electrical components, as, well as various conductive pathways including those which incorporate these conductive solder pads. Commonly, solder is applied for attachment and electrical communication between these solder pads and the surface-mounted electrical components. If the solder pads are near a via, some of the solder can travel from the solder pad area into the via during processing, and may further enter the via through a top surface opening or a bottom surface opening, leaving insufficient solder at the solder pad for adequate attachment and electrical contact with the corresponding surface-mounted electrical components.

To prevent this solder loss when the solder falls into such a via, the vias are typically filled with a "hole-fill paste" which can be conductive or non-conductive depending on the particular laminated structure design.

During typical hole-fill processes, excess paste is removed, often by wiping the board with a squeegee. This approach can work for conventional rigid printed circuit assemblies, where the surface is flat. However, in some situations, particularly for rigid flex printed circuit assemblies, for example, the surface is often uneven because it has steps and cut-out areas, as well as transitions between rigid portions and flexible portions. In circumstances like these, a squeegee wiping approach to removing excess hole-fill paste is more challenging and may not even be feasible.

Various approaches have been tried to overcome this difficulty, such as using multiple small masks painstakingly applied to various regions on the board, or careful selective sanding. Another approach has been to use a laser to vaporize excess hole-fill paste that extends onto copper plated portions. None of these approaches is believed to be as simple, efficient, or reliable as the squeegee approach has proven to be for circuit boards that have perfectly flat surfaces.

As such, there is a continuing need for improved methods for fabricating printed circuit boards, particularly as it relates to a need for more efficient and reliable approaches for hole-fill processes and the removal of excess hole-fill paste. It will be further appreciated that there is a particular need for alternative methods for printed circuit assemblies that have steps or cut-out areas as are often found in rigid flex printed circuit board subassemblies.

SUMMARY OF THE INVENTION

The present invention will enable manufacturers to fabricate printed circuit boards with greater efficiency. According to embodiments of the present invention, a process for fabricating printed circuit boards is provided that comprises the steps of: 1) providing a laminated printed circuit board subassembly having a top surface and a plurality of vias; each of the plurality of vias including a top surface opening in the top surface; 2) applying a polymer film to the top surface of me laminated printed circuit board subassembly; and 3) creating a hole in the polymer film proximate each of the plurality of top surface openings so as to expose each of the plurality of vias to facilitate access to each of the plurality of vias for a subsequent hole-fill step. In preferred embodiments, the polymer film is an adhesive backed polymer film having an adhesive backing; wherein the step of applying the adhesive backed polymer film to the top surface includes adhering the adhesive backing to the top surface. In alternate embodiments, the step of applying the polymer film to the top surface further includes the step of applying an adhesive to a back surface of the polymer film such that the adhesive adheres to the back surface of the polymer film; and the step of applying the polymer film to the top surface of the laminated printed circuit board subassembly includes adhering the adhesive to the top surface. In yet further embodiments of the present invention, the laminated printed circuit board subassembly includes a bottom surface in which each of a plurality of vias has a bottom surface opening; wherein the process further includes the steps of: applying a polymer film to the bottom surface; and creating a hole in the polymer film proximate each of a plurality of bottom surface openings. In further embodiments of the present invention, a process for fabricating printed circuit boards is provided that comprises the steps of 1) providing a laminated printed circuit board subassembly having a top surface, a bottom surface and a plurality of vias; each of the plurality of vias including a top surface opening in the top surface and a bottom surface opening in the bottom surface; 2) applying a first sheet of polymer film to the top surface of the laminated printed circuit board subassembly and a second sheet of polymer film to the bottom surface of the laminated printed circuit board subassembly; and 3) creating a plurality of holes in each of the respective sheets of polymer film, wherein each of the plurality of holes is proximate either one of the plurality of top surface openings or one of the plurality of bottom surface openings, respectively, so as to expose each of the respective openings to facilitate a subsequent step of filling each of the vias with hole-fill paste. In a further alternate embodiment, the present invention includes a covered laminated printed circuit board subassembly, comprising a laminated printed circuit board subassembly including a plurality of layered subassemblies, a top surface, a bottom surface and a plurality of vias electrically interconnecting certain of the layered subassemblies; each of the plurality of vias including a top surface opening in the top surface and a bottom surface opening in the bottom surface; and a removable polymer film material adhering to one of the group consisting of the top surface, the bottom surface and the top surface and the bottom surface; wherein any such polymer film material adhering to the top surface, the bottom surface or the top surface and the bottom surface includes a plurality of holes proximate each of the plurality of top surface openings or bottom openings to facilitate depositing hole-fill paste in each of the plurality vias. In other embodiments, the process of the present invention will preferably include the step of filling each of the plurality of vias with hole-fill paste in a variety of ways. In preferred embodiments, the hole-fill paste is a hole-fill paste that will at least partially harden when it is cured, and wherein, after filling each of the plurality of vias with hole-fill paste, the process will preferably further include the step of at least partially curing the hole-fill paste, wherein, after the step of at least partially curing the hole-fill paste, the process will preferably include the step of removing the polymer film from the top surface, and preferably the bottom surface, of the laminated printed circuit board subassembly. In preferred embodiments the step of creating holes in the polymer film proximate the plurality of top surface openings, and/or the bottom surface openings, preferably includes employing a computer numeric controlled (CNC) laser cutting system to cut the polymer film in a manner directed by a CNC program to expose the plurality of top surface openings. In further preferred embodiments of the present process, the process will preferably include the steps of removing the polymer film from the laminated printed circuit board subassembly; and using a CNC soldering system to secure surface-mountable electrical components to the laminated printed circuit board subassembly according to a computer program.

According to various embodiments of the present invention, there are provided methods for removing excess hole-fill paste from rigid flex printed circuit board assemblies.

According to embodiments of the present invention, there are provided printed circuit board laminated assemblies fabricated according to the present methods.

As used herein, the term "printed circuit boards" includes flexible and rigid flex circuit boards, as well as the more traditional printed circuit boards, regardless of whether they comprise rigid "boards".

In one example, the present invention comprises a method of fabricating printed circuit boards. This example includes the steps of providing printed circuit layer subassemblies which can be single and/or double-sided, wherein at least two of the printed circuit layer subassemblies have holes or vias there through, laminating the printed circuit layer subassemblies to form a laminated printed circuit subassembly, where at least two holes in the printed circuit layer subassemblies align to form at least one via in the laminated printed circuit subassembly, and providing an adhesive polymer film and applying it to the laminated printed circuit subassembly, forming holes in the adhesive polymer film corresponding to a via which is desired to be filled with hole-fill paste.

In another example, the present invention comprises the method described above, with additional steps of filling the via with hole-fill paste, and removing excess hole-fill paste by removing the adhesive polymer film from the laminated printed circuit subassembly.

One key aspect and feature of the present invention is a printed circuit board with an adhesive polymer layer applied to cover the surface of the printed circuit board, which protects the underlying structures of the printed circuit board during hole-fill process steps.

Another key aspect and feature of the present invention is a printed circuit board with an adhesive polymer layer applied to cover the surface of the printed circuit board, which facilitates efficient removal of excess hole-fill paste after hole-fill process step(s).

A further key aspect and feature of the present invention is a process for fabricating printed circuit boards, wherein an adhesive polymer layer is applied to the surface of the printed circuit board prior to applying hole-fill paste and removed from the printed circuit board after applying hole-fill paste thereby also removing excess hole-fill paste.

Having thus briefly described some illustrative embodiments of the present invention, and having mentioned some significant aspects and features of the present invention, it is the principal object of the present invention to provide methods for fabricating printed circuit boards.

Another object of the present invention is to provide hole-fill process steps for efficient fabrication of printed circuit boards, especially printed circuit boards with thin or fragile structures, or where the board surface is not flat, such as rigid flex boards which have varied thickness, cutouts, holes, and other discontinuities.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof, wherein.

DETAILED DESCRIPTION

Figure 1A:
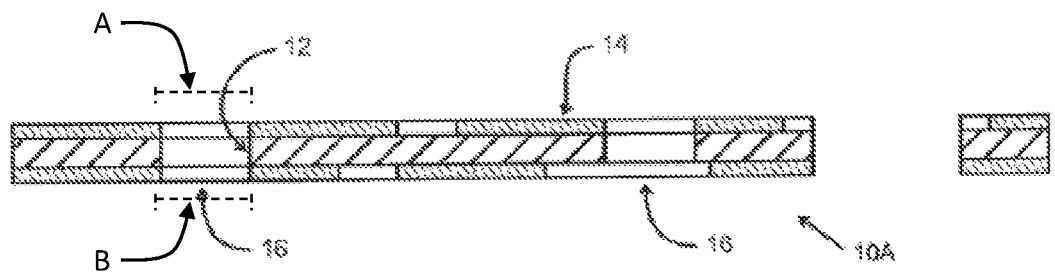
FIG. 1A is a schematic cross-sectional view of a circuit board subassembly, one of a plurality of subassemblies forming a portion of a laminated circuit board subassembly of FIG. 2.
Figure 1B:
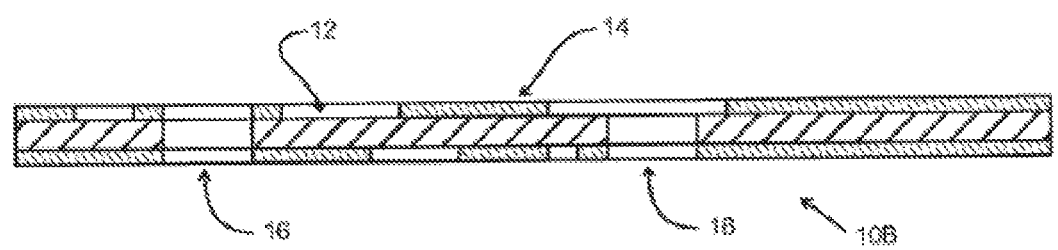
FIG. 1B is a schematic cross-sectional view of another circuit board subassembly, one of a plurality of subassemblies forming a portion of a laminated circuit board subassembly of FIG. 2.
Figure 1C:
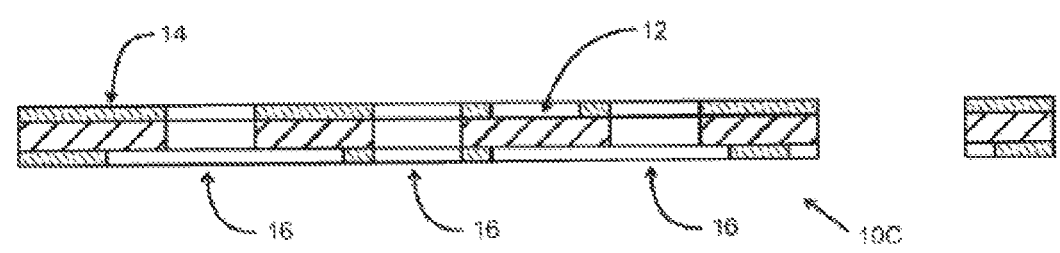
FIG. 1C is a schematic cross-sectional view of a further circuit board subassembly, one of a plurality of subassemblies forming a portion of a laminated circuit board subassembly of FIG. 2.
Figure 1D:
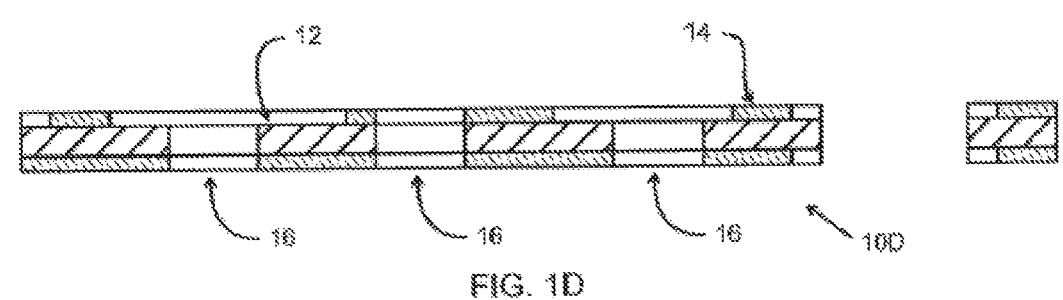
FIG. 1D is a schematic cross-sectional view of an additional circuit board subassembly, one of a plurality of subassemblies forming a portion of a laminated circuit board subassembly of FIG. 2.

The fabrication of printed circuit boards, flexible electronic circuits, and rigid flex circuits has developed to great success, with many methods and refinements over the years, but still with limitations and difficulties in some situations. The present invention addresses limitations and difficulties in fabricating certain types of such circuit boards, especially including rigid flex circuit boards. As referenced herein, the terminology "printed circuit boards" (or "PCB") is meant to include similar flexible electronic circuit boards and rigid flex circuit boards. Such printed circuit boards are typically fabricated by laminating multiple conductive and nonconductive layers, with precisely patterned conductive layers fabricated by photochemical etching processes, printing-type processes, or other additive or subtractive processes.

Although a printed circuit board can have a single base layer, with a conductive patterned layer printed on one or both side of the base layer, a laminated printed circuit subassembly is typically formed of a plurality of layers, each layer being a subassembly having a nonconductive base layer and a conductive patterned layer printed on one or both sides of the base layer, providing conductive paths between various areas of the subassembly. Each subassembly also has various holes, and may have cut-outs through the layer. The plurality of subassemblies are stacked together in alignment and laminated, with some of the holes and cut-outs aligning between a plurality of layers, or completely through the entire laminated printed circuit board subassembly. One or more insulating layers or portions of layers may be included in the laminated printed circuit board subassembly, to limit electrical conduction between adjacent layer subassemblies. One or more dielectric layers, or portions of layers, may be included in the laminated printed circuit board subassembly, to provide capacitance. One or more rigid layers or "boards", or portions of layers, may be included in the laminated printed circuit board subassembly, to provide rigidity, support, or strength. Where it is desired to conduct between a plurality of subassemblies or layers at locations of holes, a conductive hole plating is applied to the hole. The plated hole then acts as a "via" to conduct electricity between the subassemblies or layers, specifically at the locations of the via. From the via, the various conductive pattern layers of each subassembly conduct electricity to selected areas of the subassemblies as desired.

After the plurality of subassemblies are laminated together to form a multi-layer laminated printed circuit board subassembly, surface-mounted components can be attached to one or more exposed surfaces of the multi-layer laminated printed circuit board subassembly. These components may include resistors, capacitors, inductors, relays, switches, lamps, display components, diodes, transistors, integrated circuits, sensors, cables, wires, connectors, sockets, and other components as are known in the art. Further processing steps may include applying solder to selected locations on the exposed surface layer(s), to facilitate incorporation of surface-mounted components in the circuit by applying them to and electrically connecting them to the surface layer; small amounts of solder are carefully applied to specific locations such as solder pads where the surface-mounted components need to be connected. To prevent migration of solder into nearby holes and vias, which could provide electrical conduction paths where they are not wanted, and may also result in too little solder present at the desired connection locations, such holes or plated vias are filled with a "hole-fill paste". The hole-fill paste can be either a conductive or nonconductive paste, and the process steps of filling the holes or vias with hole-fill paste is often referred to as a hole-fill step or just "hole-fill". Hole-fill paste in other areas of the laminated printed circuit board subassembly, such as other cut-outs around flexible portions of a rigid flex assembly, can interfere with proper function or subsequent processing of those other areas. For example, undesired hole-fill paste may physically occupy areas intended to remain open or available for other components or to fit in the intended application; in another example, undesired hole-fill paste can stiffen portions of a rigid flex circuit which are intended to be flexible to function properly in the intended application. In another example, undesired conductive hole-fill paste can provide unintended electrical communication between electrical conduction paths or components and cause improper function of the completed circuit or assembly. Therefore, it is desirable to prevent hole-fill paste from getting to those areas of the laminated printed circuit board subassembly, while still filling the holes and vias as intended.

With a simple flat printed circuit board, it may be simple to wipe or squeegee excess hole-fill paste that has been placed or migrated away from the desired hole-fill locations. However, in many situations, especially where the printed circuit board is not a simple flat structure, but has different thicknesses, cut-outs, and so forth, it can be difficult to avoid placement or migration of hole-fill paste to the unintended areas.

To avoid undesired migration of hole-fill paste, the present invention provides a polymer film which is applied to the laminated printed circuit board subassembly. In some embodiments of the present invention, the polymer film is applied to a surface of the laminated printed circuit board subassembly using adhesive. Holes are created in polymer film to expose vias; for example, the polymer film can be cut to an appropriate pattern such as using a laser or other cutting or ablating mechanism, so that the holes and any other areas where it is desired to place hole-fill paste are exposed, but other areas are masked and protected by the polymer film. The polymer film adhesive is chosen to provide sufficient adherence to the laminated printed circuit board subassembly to control the movement of hole-fill paste, but which can be easily removed when it is no longer needed. In some embodiments, a self-adhesive polymer film is used, which comprises a polymer base layer and an adhesive layer. In this case, the polymer film may be referred to herein as an adhesive polymer film, but it is understood that a polymer film that does not incorporate an adhesive layer can be used, with separate adhesive material applied. Thermal or chemical methods of attaching the polymer film can be used, as long as the attachment mechanism provides sufficient adhesion yet allows for removal of the polymer film without damaging the underlying laminated printed circuit board subassembly.

In the present invention, after applying the polymer film and creating holes in the film to access the vial, hole-fill paste is applied and forced into the holes to avoid significant air inclusions which can be detrimental, and is typically wiped such as with a squeegee to remove excess. Typically, after a "soft" or partial curing or hardening of the hole-fill paste so that the hole-fill paste stays in position as desired, the adhesive polymer film is removed from the laminated printed circuit board subassembly. Any excess hole-fill paste extending from the holes is removed, such as by a local sanding or other machining operation, to produce locally flat surfaces on the laminated printed circuit board subassembly in the vicinity of the filled holes or vias. The hole-fill paste is then "hard" cured to provide improved strength and stability. A conductive overcoat may be applied such as by a "printing" plating process to produce surface conductive paths of sufficient quality after hole-fill. As an alternative to separate soft-cure and hard-cure steps, certain hole-fill paste material can be fully cured at a single step, such as prior to removing the polymer film, for example.

After hole-fill, solder is applied to select locations on the top and/or bottom surfaces of the laminated printed circuit board subassembly so that surface-mounted components can be attached, as previously stated.

One or more rigid layers or "boards", or portions of layers, may be included in the laminated printed circuit board subassembly, to produce rigid, flexible, or combination rigid flex circuit boards, as desired. The rigid layers may be included between layers of the laminated printed circuit board subassembly, or may be applied to the top surface or bottom surface of the laminated circuit board. For a rigid flex circuit board, typically only portion(s) of the laminated circuit board will be reinforced by rigid board, such as areas where surface components will be applied. The resulting laminated printed circuit board subassembly may not have uniform thickness, but instead may have steps or discontinuities, with thicker and thinner portions. Steps, cut-outs, and other discontinuities present significant difficulty with the prior art hole-fill processes; in particular, the wiping or squeegee steps to remove excess hole-fill paste are difficult, irreproducible, or otherwise impractical. In other cases, such as if the conductive patterned layer at the top surface or bottom surface of the laminated printed circuit board subassembly is very thin or fragile, the prior art methods of hole-fill and excess hole-fill paste removal can damage the conductive patterned layer.

While a printed circuit board, for the present invention, typically comprises a plurality of subassemblies laminated together, a single base layer with a patterned conductive layer on one or both sides can be used. Such a structure can have one or more rigid boards for reinforcement of portions of the printed circuit board, as described herein, laminated or otherwise bonded to or incorporated with it. Thus, where the terminology "laminated printed circuit board subassembly" is used herein, the terminology is meant to also describe a structure comprising a single subassembly, even though the single subassembly may not actually be "laminated" to other subassemblies, but which may be laminated to rigid board(s). Similarly, descriptions of subsequent or derivative structures based on or comprising a "laminated printed circuit board subassembly", such as a completed and populated printed circuit board, or a laminated printed circuit board with at least one polymer film applied, for example, these structures could comprise a single subassembly.

Figure 12:
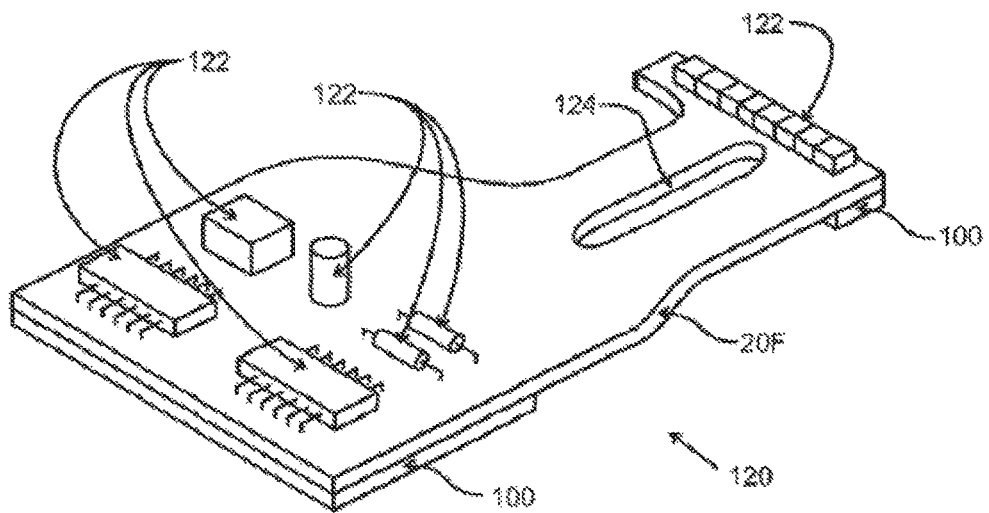
FIG. 12 is an isometric view illustrating a printed circuit board comprising the laminated circuit board subassembly of FIG. 11 populated with surface-mounted component(s)

Referring now to the drawings, FIGS. 1A-1D illustrate example layers or subassemblies 10A-D for a printed circuit board according to the present invention (such as printed circuit board 120 illustrated in FIG. 12). Each subassembly 10 comprises a nonconductive base layer 12 which can have a patterned conductive portion 14 applied to one or both sides of the nonconductive base layer 12. Thus, each subassembly may be single-sided or double-sided. The patterned conductive portion is typically fabricated by a photochemical, etching, printing, or other processes or combinations of processes as are known in the art. The subassemblies 10 can have holes 16 in specific layers or other cut-outs or gaps, some of which may align or correspond between selected layers in various subassemblies 10 (see 10A, 10B, 100, 10D). Although in certain instances laser drilling can be used in embodiments of the present invention (whereby laser drilling typically forms conical shaped holes), in other embodiments, the vias are made by techniques other than laser drilling. For example, the holes 16 may be formed by a technique that produces a cylindrical-shaped sidewall for each of the holes 16 (e.g., mechanical drilling). In some embodiments, each of the holes 16 includes a top diameter A and a bottom diameter B, the top diameter A being substantially similar to the bottom diameter B. In some embodiments, a cross section of the side wall/holes 16 shows a substantially parallel or parallel relationship (e.g., cylindrical). Various numbers of layer subassemblies 10 can be used, such as 1 to 100 or more, and some areas of the printed circuit board can have different numbers of layer subassemblies than other areas of the printed circuit board. Note that in the Figures, the various items are not shown to scale; in particular, the thickness of the various layers are not shown to scale, for clarity of illustration.

Figure 2:
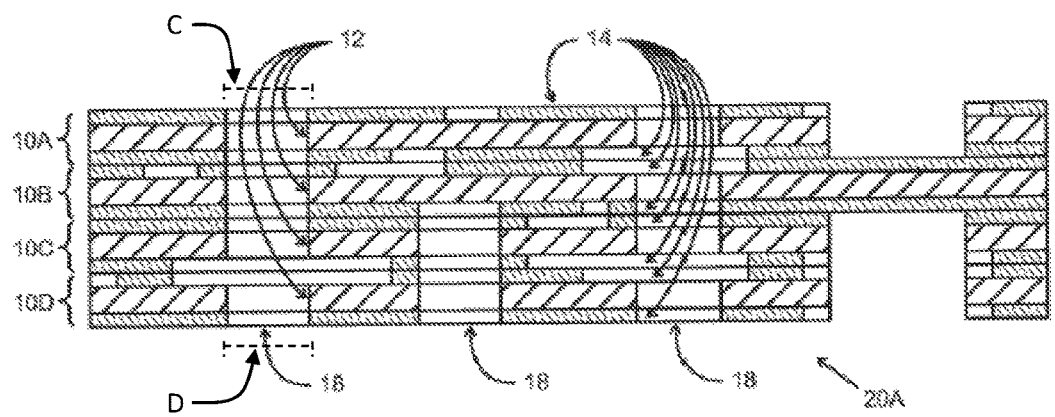
FIG. 2 is a schematic cross-sectional view of a laminated circuit board subassembly comprising the plurality of subassemblies of FIGS. 1A-1D, showing vias.

Although a single subassembly 10 can be utilized to fabricate a printed circuit board, typically a plurality of layer subassemblies 10 are stacked together in alignment and laminated as illustrated in FIG. 2 to form a laminated printed circuit board subassembly 20A. Typically, some of the holes 16 or other cut-outs of subassemblies 10 (see 10A, 10B, 100, 10D) align, to form vias 18 that pass through a plurality of subassemblies 10. In some embodiments, the vias 18 may be formed from aligned holes 16. In some embodiments, each of the vias 18 includes a sidewall that is cylindrical in shape. In some embodiments, a cross section of the side wall/via 18 shows a substantially parallel or parallel relationship (e.g., cylindrical). In some embodiments, each of the vias 18 includes a top diameter C and a bottom diameter D, the top diameter C being substantially similar to the bottom diameter D. Vias 18 can communicate through all subassemblies 10, resulting in through-holes in the printed circuit board, or can communicate with fewer than all subassemblies 10. One or more insulating layers or portions of layers may be included in a laminated printed circuit board subassembly 20A to limit electrical conduction between adjacent layer subassemblies 10. One or more dielectric layers, or portions of layers, may be included in the laminated printed circuit board subassembly 20, to provide capacitance, as is known in the art and one or more rigid layers or "boards", or portions of layers, also may be included in the laminated printed circuit board subassembly, to provide rigidity, support, or strength.

Figure 3:
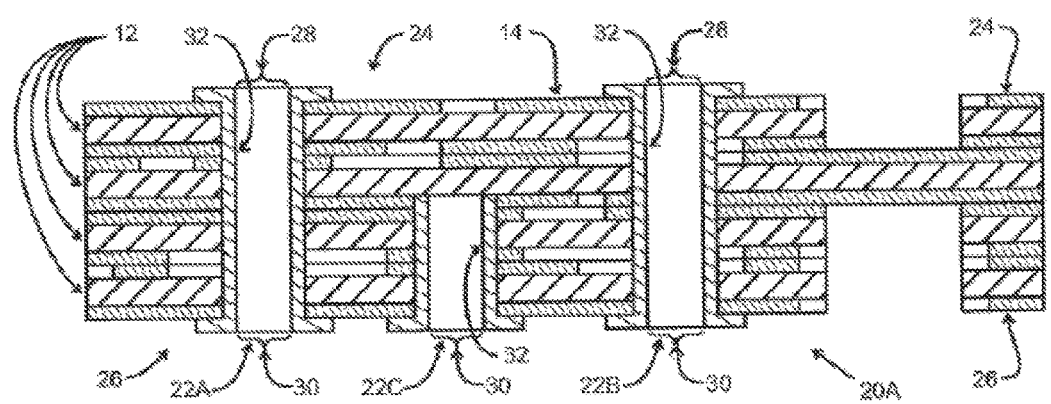
FIG. 3 is a schematic cross-sectional view of the laminated circuit board subassembly of FIG. 2 with conductive hole plating applied to vias.

Referring now also to FIG. 3, some of the vias 18 shown in FIG. 2 can be used to provide electrical communication between a plurality of layer subassemblies 10 where such electrical communication is desired for proper function of the resulting circuit. These vias 18 are plated with conductive hole plating 32, to form conductive vias 22A, 22B, 220. Other holes or cut-outs may not be used to provide electrical communication between layer subassemblies, and may not be plated with conductive hole plating. These other holes or cut-outs may be used for heat transfer, such as thermal vias, or for mechanical mounting or alignment holes, and so forth.

Laminated circuit board subassemblies 20A have a top surface 24 and a bottom surface 26. Some conductive vias 22A, 22B extend through all layers of the laminated circuit board subassembly 20A, while other conductive vias may be blind vias 22C or buried vias (not shown) as previously described. Conductive vias 22A, 22B which extend to top surface 24 have a top surface opening 28 and conductive vias 22A, 22B, 22C which extend to bottom surface 26 have a bottom surface opening 30. The schematic illustration shown in FIG. 3 shows two conductive vias 22A and 22B each extending through all layers of laminated circuit board subassembly 20A and having a top surface opening 28 at top surface 24 and a bottom surface opening 30 at bottom surface 26 (typically called standard, or through, or through hole vias). FIG. 3 also illustrates a conductive via 22C which is a blind via, which extends through some of the layers of laminated circuit board subassembly 20A and has a bottom surface opening 30 at bottom surface 26, but does not extend to top surface 24.

Figure 4A:
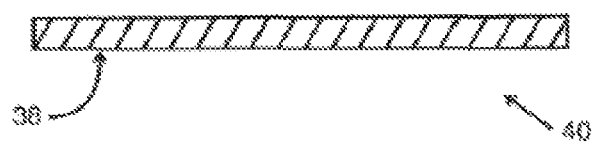
FIG. 4A is a schematic cross-sectional view of a polymer film to be applied to the laminated circuit board subassembly of FIG. 3.
Figure 4B:
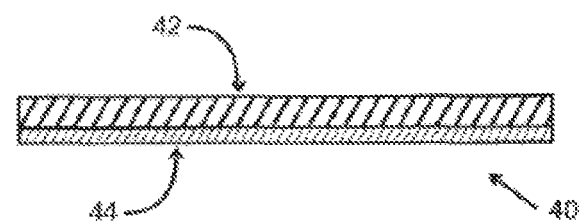
FIG. 4B is a schematic cross-sectional view of an adhesive polymer film to be applied to the laminated circuit board subassembly of FIG. 3.
Figure 4C:
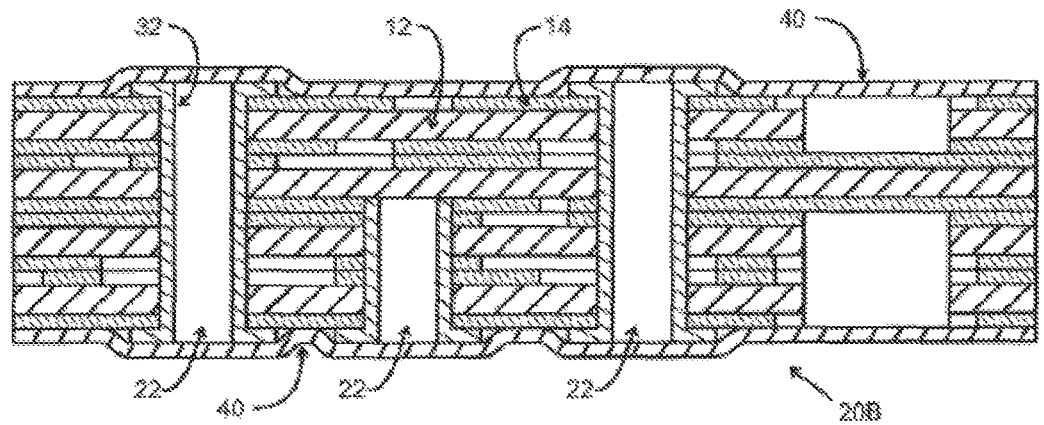
FIG. 4C is a schematic cross-sectional view of polymer films applied to the top surface and the bottom surface of the laminated circuit board subassembly of FIG. 3.
Figure 4D:
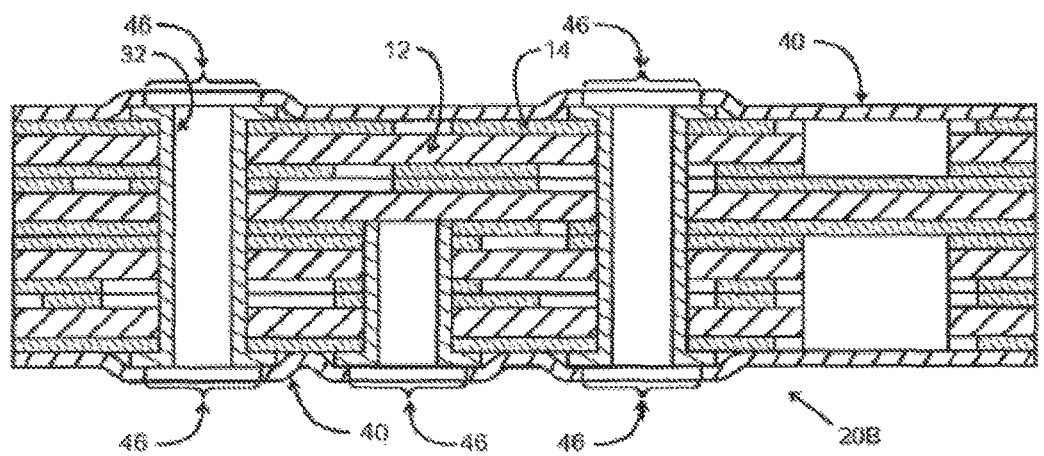
FIG. 4D is a schematic cross-sectional view illustrating the laminated circuit board subassembly of FIG. 4C with holes created in the polymer films to expose holes, vias, or other areas of the laminated circuit board subassembly.
Figure 5:
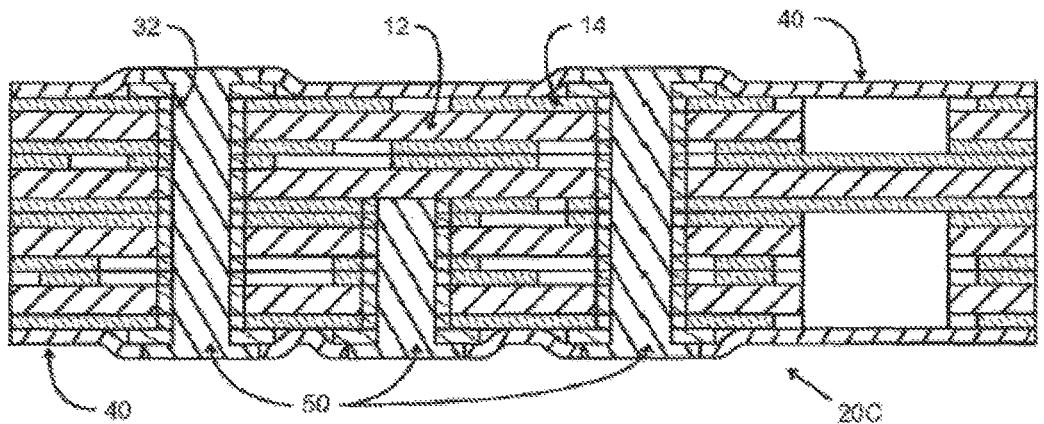
FIG. 5 is a schematic cross-sectional view illustrating hole-fill paste applied to the laminated circuit board subassembly of FIG. 4D.

Referring now also to FIGS. 4A-9, it will be appreciated that in order to prevent migration of solder 90 on the surface layer 24, 26 as described further below, the vias 18 or conductive vias 22 are generally filled with hole-fill paste 50 (see FIG. 5). Hole-fill paste 50 can be either conductive or nonconductive, and some vias 18 or conductive vias 22 may be filled with conductive hole-fill paste 50 while other vias 18 or conductive vias 22 or other cut-outs may be filled with nonconductive hole-fill paste 50. Still other vias 18 or conductive vias 22 or other cut-outs may be left without being filled with hole-fill paste. Hole-fill paste in certain areas of the laminated printed circuit board subassembly, such as at other cut-outs around flexible portions of a rigid flex assembly, can interfere with proper function or subsequent processing of those other areas. For example, undesired hole-fill paste may physically occupy areas intended to remain open or available for other components or to fit in the intended application; in another example, undesired hole-fill paste can stiffen portions of a rigid flex circuit which are intended to be flexible to function properly in the intended application. In yet another example, undesired conductive hole-fill paste can provide unintended electrical communication between electrical conduction paths or components and cause improper function of the completed circuit or assembly. Therefore, it will be appreciated that it is desirable to prevent hole-fill paste from getting to certain areas of a laminated printed circuit board subassembly 20A, while still filling the vias 18 and conductive vias 22 with hole-fill paste as desired to prevent solder 90 from migrating into the vias 18, 22.

To avoid undesired migration of hole-fill paste 50 to areas on the respective surfaces 24, 26 of the laminated printed circuit board subassembly 20A, where manufacturers do not want the hole-fill paste to be, the present inventors have used a polymer film 40, illustrated in FIG. 4A, which is preferably applied to one or the other or both of the top and bottom surfaces 24, 26, respectively, of the laminated printed circuit board subassembly 20A shown in FIG. 3, as illustrated in FIG. 4C. In some embodiments of the present invention, the polymer film 40 is applied to the respective surface 24, 26 of the laminated printed circuit board subassembly 20A using an adhesive (not shown) that is applied to the back surface 38 of the polymer film 40. The polymer film 40 may be attached to either surface 24, 26 of the laminated printed circuit board subassembly 20A by other well known means, as well. With an adhesive approach, the adhesive is chosen to provide sufficient adherence to laminated printed circuit board subassembly 20A to control the movement of hole-fill paste 50, but still permit efficient removal when the polymer film 40 when it is no longer needed. In some embodiments, polymer film 40 is a self-adhesive polymer film, which has a polymer base layer 42 and adhesive layer 44 as illustrated in FIG. 4B. In this case, polymer film 42 may be referred to herein as an adhesive polymer film 40 or an adhesive backed polymer film 42, but it is understood that a polymer film that does not incorporate an adhesive layer can be used, with separate adhesive material applied or if the polymer film can be adhered directly to the surface 24, 26 of the laminated PCB subassembly 20A. In addition, or in the alternative, thermal, or chemical methods of attaching polymer film 40 to a laminated printed circuit board subassembly 20A can be used, as long as the attachment mechanism provides sufficient adhesion to limit the migration of the hole-fill paste 50 and still allow for easy and efficient removal of the polymer film 40, 42 without damaging the underlying laminated printed circuit board subassembly 20A.

The polymer film 40 can, for example, comprise polyimide, thermoplastic polyolefins (including, but not limited to polyethylene, polypropylene, polymethylpentene, polybutene-1), polyolefin elastomers (including, but not limited to polyisobutylene, ethylene propylene rubber, ethylene propylene diene monomer M-class rubber, UV treated polyolefins, polyvinyl chloride, polyester, polyvinyl alcohol, polyethylene terephthalate, copolymers of the same, combinations of the same and the like. For adhesive backed polyme, films, the adhesive layer 44 can, for example, comprise solvent-based adhesive, contact-sensitive adhesive, pressure-sensitive adhesive, thermal-activated adhesive, thermal-release adhesive, water-soluble adhesive, and can further comprise rubber adhesives, silicone adhesive, acrylic adhesive, and may comprise medium-tack adhesive, combinations, and the like. Non-adhesive polymer films 40 may be adhered to a surface 24, 26 of a laminated printed circuit board subassembly 20A by applying a separate adhesive such as those listed or other convenient adhesive, or by thermal, chemical, compression, vacuum, or other methods or combinations.

For example, thermal means for attaching polymer film 40 to laminated printed circuit board subassembly 20A can comprise applying heat to activate a thermoplastic or thermosetting material used to bond polymer film 40 to laminated printed circuit board subassembly 20A. Alternatively, thermal means for attaching polymer film 40 to laminated printed circuit board subassembly 20A can comprise a thermally-activated adhesive material applied between polymer film 40 and laminated printed circuit board subassembly 20A and a heat source used to activate the thermally-activated adhesive material. In another alternative, thermal means for attaching polymer film 40 to laminated printed circuit board subassembly 20A can comprise using a polymer film 40 that is thermoplastic, and using a heat source to heat the thermoplastic polymer film sufficiently to make it tacky or slightly melt to removably bond to laminated printed circuit board subassembly 20A. For example, chemical means for attaching polymer film 40 to laminated printed circuit board subassembly 20A can comprise a solvent for the polymer film which is used to form a weak solvent bond between polymer film 40 and laminated printed circuit board subassembly 20A.

An example of a suitable polymer film 42 is an approximately 0.004 inch thick UV-treated polyolefin film with solvent-based rubber adhesive, known as Novacel 4228REF, manufactured by Novacel, Inc. Other similar polymer films, but with different dimensions, polymer material, or adhesive, can also be used.

The polymer film 40, 42 is typically applied to both the top surface 24 and the bottom surface 26 of the laminated printed circuit board subassembly 20A to create a covered laminated printed circuit board subassembly 2013 as illustrated in FIG. 4C. However, in some situations, it can be advantageous to apply polymer film 40, 42 to only one of the top surface 24 or the bottom surface 26. For example, with a laminated printed circuit board subassembly 20A having only blind vias open to only the top surface 24, it is likely that there may be no need for polymer film on the bottom surface 26, and vice versa.

As illustrated in FIG. 4D, after polymer film 40 is applied to laminated printed circuit board subassembly 20A to form a covered laminated printed circuit board subassembly 20B, the polymer film 40 is cut to create a plurality of access holes 46 proximate a plurality of top surface openings 28 and/or bottom surface openings 30 to allow access to the vias 18, 22 through the respective openings 28, 30. The access holes 46 are preferably cut using a laser, preferably a CNC laser system (not shown), or other cutting or melting or ablating mechanism to create access holes 46 in the polymer film 40, 42 proximate the openings 28, 30 to the respective vias 18 or conductive vias 22 on the top and bottom surfaces 24, 26 of the covered laminated PCB subassembly 20B. The access holes 46 allow the manufacturer to fill the respective vias 18, 22 through the respective openings 28, 30 and the polymer film 40, 42 can prevent or at least minimize the degree to which the hole-paste will migrate to other areas on the respective surfaces of the covered laminate PCB subassembly 20B, so that other areas are masked and protected by polymer film 40, 42. In preferred embodiments, a covered laminate PCB subassembly 20' is created where the adhesive backing on the polymer film 40, 42 adheres edges of the respective holes 46 to the respective surface 24, 26 so that hole-fill paste 50 in unable to migrate away from the respective openings 28, 30 along the respective surface 24, 26. A laser system for creating or cutting holes 46 may be computer-controlled, or a CNC laser system, with a computer program or software template corresponding to a desired cut pattern.

After applying polymer film 40, 42 the respective surface and creating holes 46 in the respective polymer film 40, 42 to permit access to selected locations, such as the respective openings 28, 30 to the respective vias 18, 22, hole-fill paste 50 is applied to the covered laminated PCB subassembly 20B in order to fill selected vias 18 and/or conductive vias 22 as desired. Hole-fill paste 50 is forced into vias 18 or conductive vias 22 so as to avoid significant air inclusions which can be detrimental, and the outer surface of the polymer film 40, 42 is typically wiped clean with a squeegee to remove excess hole-fill paste 50 that extends out beyond the polymer film 40, 42 proximate the respective access holes 46, to create a covered and filled laminated printed circuit board subassembly 20C such as that illustrated in FIG. 5.

Prior to removing polymer film 40, 42, the hole-fill paste 50 is preferably cured or hardened sufficiently to stabilize hole-fill paste 50 so that it will not break away from the areas proximate the respective openings 28, 30 during removal of polymer film 40, 42.

The amount of curing is based on the curing time and the curing temperature. In some embodiments, curing is conducted for a time selected from: between 1 and 48 hours, between 1 and 36 hours, between 1 and 24 hours, between 1 and 12 hours, between 1 and 6 hours, between 1 and 5 hours, between 1 and 4 hours, and between 2 and 4 hours. In some embodiments, curing is conducted for a time selected from: about 1 hour, about 2 hours, about 3 hours, about 4 hours, about 5 hours, about 6 hours, about 7 hours, about 8 hours, about 9 hours, about 10 hours, about 11 hours, about 12 hours, about 13 hours, about 14 hours, about 15 hours, about 16 hours, about 17 hours, about 18 hours, about 19 hours, about 20 hours, about 21 hours, about 22 hours, about 23 hours, about 24 hours, about 25 hours, about 26 hours, about 27 hours, about 28 hours, about 29 hours, about 30 hours, about 31 hours, about 32 hours, about 33 hours, about 34 hours, about 35 hours, about 36 hours, about 37 hours, about 38 hours, about 39 hours, about 40 hours, about 41 hours, about 42 hours, about 43 hours, about 44 hours, about 45 hours, about 46 hours, about 47 hours and about 48 hours.

In some embodiments, the curing is conducted at a temperature selected from: between 18° C. (64° F.) and 30° C. (86° F.), between 19° C. (66° F.) and 27° C. (80° F.), between 20° C. (68° F.) and 25° C. (77° F.), and between 21° C. (70° F.) and 23° C. (73° F.). In some embodiments, the curing is conducted at a temperature selected from: about 18° C., about 19° C., about 20° C., about 21° C., about 22° C., about 23° C., about 24° C., about 25° C., about 26° C., about 27° C., about 28° C., about 29° C., about 30° C.

As used herein, the term "about" may refer to + or −10% of the value referenced. For example, "about 9" is understood to encompass 8.2 to 9.9.

Figure 6:
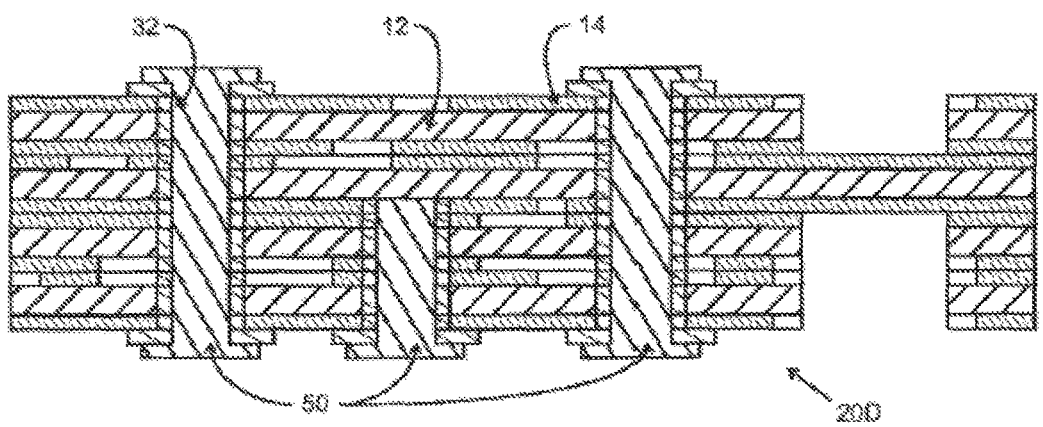
FIG. 6 is a schematic cross-sectional view illustrating the laminated circuit board subassembly of FIG. 5 after removal of the polymer film.
Figure 7:
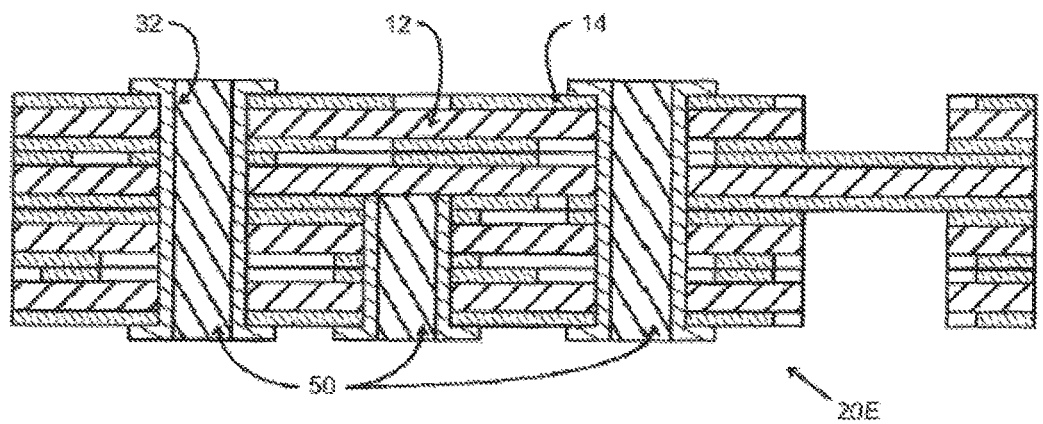
FIG. 7 is a schematic cross-sectional view illustrating the laminated circuit board subassembly of FIG. 6 after removal of excess hole-fill paste.

In preferred embodiments, after "soft" or partial curing or after hardening of hole-fill paste 50 to ensure that hole-fill paste 50 stays in position as desired, the polymer film 40, 42 is removed from the covered and filled laminated printed circuit board subassembly 20'', to form a filled laminated printed circuit board subassembly 200, such as that illustrated in FIG. 6. Typically, excess hole-fill paste 50 extending above the respective openings 28, 30 to the respective vias 18, 22 will be exposed after polymer film 40, 42 is removed, as illustrated In FIG. 6.

Typically, any such undesired hole-fill paste 50 extending above the respective openings 28, 30 to the respective vias 18, 22 will then be removed, such as by a local sanding or other machining operation, to leave the outer surface of the hole-fill paste 50 flush with the top of the conductive hole plating 32 proximate the respective opening 28, 30. This step will leave the surface of the hole-fill paste 50 flat the respective openings 28, 30 on filled and leveled laminated printed circuit board subassembly 20E illustrated in FIG. 7. In preferred embodiments, the hole-fill paste 50 is then further cured or hardened to provide improved strength and stability. This curing or hardening may be a complete or "hard" curing beyond the "soft" curing or hardening as described above. Alternatively, the initial curing or hardening prior to removal of polymer film 40, 42 may provide sufficient strength and stability without a separate, second curing or hardening step.

Figure 8:
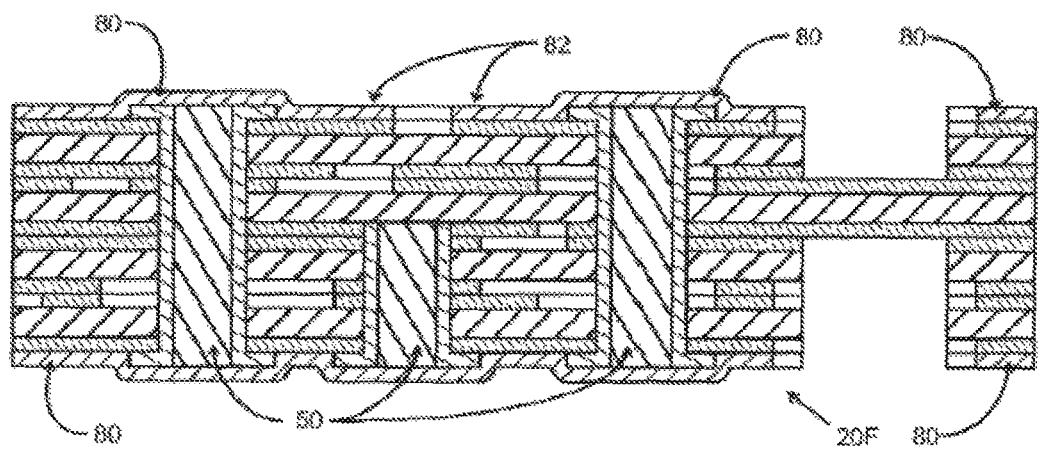
FIG. 8 is a schematic cross-sectional view illustrating the laminated circuit board subassembly of FIG. 7 after applying a conductive overcoat.

As illustrated in FIG. 8, a conductive overcoat 80 may be applied such as by a "printing" or plating process such as those previously described, to produce surface conductive paths of sufficient quality on an overcoated laminated printed circuit board subassembly 20F after a completion of a hole-fill process. The conductive overcoat 80 may comprise conductive pads such as solder pads 82 to facilitate attachment of and electrical communication with surface-mounted electrical components 122 (see FIG. 12), as well as various conductive pathways which incorporate these conductive solder pads 82. The conductive overcoat 80 may also comprise conductive pathways which do not incorporate conductive solder pads 82.

Figure 9:
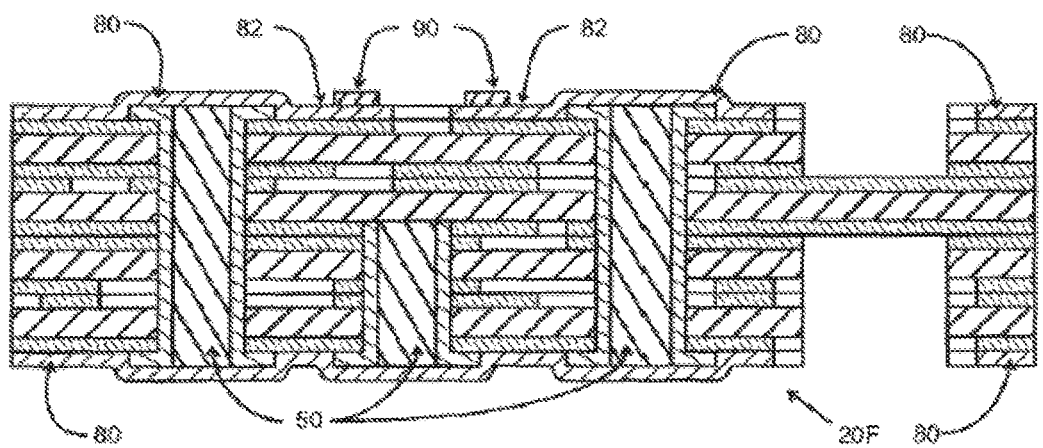
FIG. 9 is a schematic cross-sectional view illustrating the laminated circuit board subassembly of FIG. 8 after applying solder.

Surface-mounted components 122 can be attached to one or more exposed surfaces of the overcoated laminated printed circuit board subassembly 20F. These surface-mounted components 122 may include resistors, capacitors, inductors, relays, switches, lamps, display components, diodes, transistors, integrated circuits, sensors, cables, wires, connectors, sockets, and other components as are known in the art. Surface-mounted components 122 are located at specific sites such as solder pads 82 on the exposed surface(s) of the overcoated laminated printed circuit board subassembly 20F. To facilitate incorporation of surface-mounted components 122 in the circuit by applying them to and electrically connecting them to the surface layer, small amounts of solder 90 can be applied at specific locations such as solder pads 82 where surface-mounted components 122 are to be connected. Commonly, solder 90 is applied for attachment and electrical communication between these solder pads 82 and surface-mounted electrical components 122 as illustrated in FIG. 9. Hole-fill paste 50 in any via 18 or conductive via 22 near the location of solder 90 helps to prevent migration of solder 90 into the via 18 or conductive via 22.

Figure 10:
FIG. 10 is a schematic cross-sectional view of a rigid board for reinforcing a portion of the laminated circuit board subassembly of FIG. 9.

One or more rigid layers 100, or portions of layers, may be included in overcoated laminated printed circuit board subassembly 20F, to produce rigid, flexible, or combination rigid flex circuit boards, as desired. Rigid board 100, as illustrated in FIG. 10, may be utilized for rigid layers in an overcoated laminated printed circuit board subassembly 20F.

Figure 11:
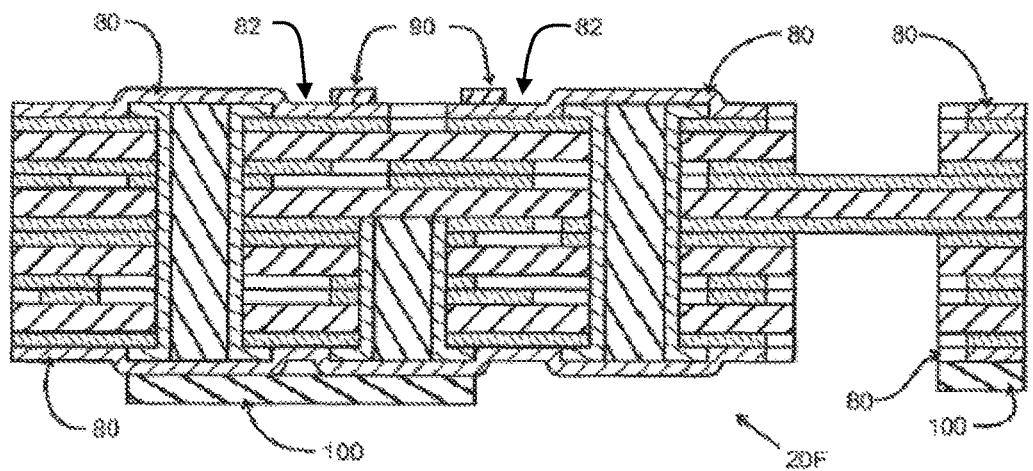
FIG. 11 is a schematic cross-sectional view illustrating the rigid board of FIG. 10 attached to a portion of the laminated circuit board subassembly of FIG. 9.

FIG. 11 illustrates an example overcoated laminated printed circuit board subassembly 20F that includes a rigid board 100. In the example of FIG. 11, rigid board 100 is applied to bottom surface 26 of the overcoated laminated printed circuit board subassembly 20F after conductive overcoat 80 has been applied. Alternatively, rigid board 100 may be included between layers of overcoated laminated printed circuit board subassembly 20F, or may be applied to top surface 24 or bottom surface 26 of the overcoated laminated circuit board subassembly 20F. A plurality of rigid boards 100 may be included, at one or more locations in the overcoated laminated printed circuit board subassembly 20F, such as at both the top surface 24 and the bottom surface 26, or at a plurality of locations between subassemblies 10, within the overcoated laminated printed circuit board subassembly 20F, or combinations thereof. For a rigid flex circuit board, typically only portion(s) of an overcoated laminated circuit board subassembly 20F will be reinforced by rigid board 100, such as areas where surface-mounted components 122 will be applied, although it may be advantageous to reinforce other areas of a rigid flex circuit board, such as to aid in subsequent assembly into a device incorporating the printed circuit board. Rigid board 100 may be included between subassemblies 10 within the overcoated laminated printed circuit board subassembly 20F, such as by the lamination step, or applied to the top surface 24 or the bottom surface 26 of the overcoated laminated printed circuit board subassembly 20F by lamination or adhesive, thermal, chemical, compression, vacuum, or other methods or combinations such as those cited for applying polymer film 40 to the overcoated laminated printed circuit board subassembly 20F, for example. Rigid board 100 can comprise patterned conductive layer(s), and can have holes or vias 18 or conductive vias 22; in this way, electrical circuit elements can be incorporated with rigid board 100. Surface-mounted components 122 can be mounted to rigid board 100 as well. Alternatively, rigid board 100 can simply provide rigidity or strength, without having electrical circuit elements such as patterned conductive layer(s) or surface-mounted components 122.

FIG. 12 illustrates a printed circuit board 120 comprising an overcoated laminated printed circuit board subassembly 20F, incorporating rigid board 100, populated with surface-mounted components 122. Note that some of the detailed elements of laminated printed circuit board subassembly 20, such as the conductive pattern on the surface, are present as previously described but not shown in this view. In this example two separate sections of rigid board 100 are illustrated, and a cut-out 124 has been protected from unwanted hole-fill paste 50 by use of polymer layer 40, as have vias (not shown in this view) near some of surface-mounted components 122. Although not seen in this view of the top surface of printed circuit board 120, the bottom surface of printed circuit board 120 can also have surface-mounted components 122. In this example, rigid board 100 is affixed to the bottom surface of an overcoated laminated printed circuit board subassembly 20F, although rigid board 100 can alternatively be affixed to the top surface of the overcoated laminated printed circuit board subassembly 20F, or incorporated in or between layer subassemblies 10 within the overcoated laminated printed circuit board subassembly 20F, or a combination thereof. In the illustrated example, the bottom surface is irregular, having one or more steps 126 created by affixing rigid board 100; this is another example of a situation in which protecting the laminated printed circuit board subassembly 20 from unwanted hole-fill paste 50 placement or migration by using polymer layer 40 according to the present invention is particularly useful.

Figure 13:
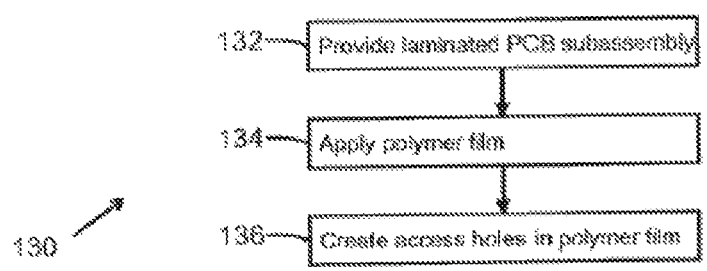
FIG. 13 is a flow diagram illustrating an example process embodiment of the present invention.

FIG. 13 illustrates an example embodiment of the present invention, in which a process for fabricating printed circuit boards 130 comprises steps of providing a laminated printed circuit board subassembly 132, applying a polymer film to the laminated printed circuit board subassembly 134, and creating access holes in the polymer film to expose vias 136. It will be appreciated that the item numbers refer to the steps in the process as illustrated, rather than the physical components.

In alternative embodiments, a process comprises steps of providing a laminated printed circuit board subassembly, temporarily attaching a polymer film to the laminated printed circuit board subassembly, cutting holes in the polymer film to expose vias, filling the exposed vias with hole-fill paste, using the polymer film to prevent placement or migration of hole-fill paste in unwanted areas of the laminated printed circuit board subassembly, and removing the polymer film from the laminated printed circuit board subassembly.

Additional embodiments preferably include the step of providing an adhesive, and wherein the step of temporarily attaching the polymer film to tile laminated printed circuit board subassembly is accomplished by using the provided adhesive.

Alternative additional embodiments preferably include the step of providing an thermal means for temporarily attaching the polymer film to the laminated printed circuit board subassembly, and utilizing the thermal means to temporarily attach the polymer film to the laminated printed circuit board subassembly.

Further additional embodiments preferably include the step of providing a chemical means for temporarily attaching the polymer film to the laminated printed circuit board subassembly, and utilizing the chemical means to temporarily attach the polymer film to the laminated printed circuit board subassembly.

Other embodiments preferably include a further step of removing excess hole paste, Further embodiments preferably include a further step of applying a conductive overcoat.

Still further embodiments preferably include a further step of applying solder.

Yet further embodiments preferably include a further step of applying surface-mounted components.

In some embodiments, the adhesive polymer film is preferably used to protect flexible portions of a rigid flex circuit board.

In still other embodiments, the adhesive polymer film is preferably used to protect delicate conductive pathways on a printed circuit board.

Figure 14:
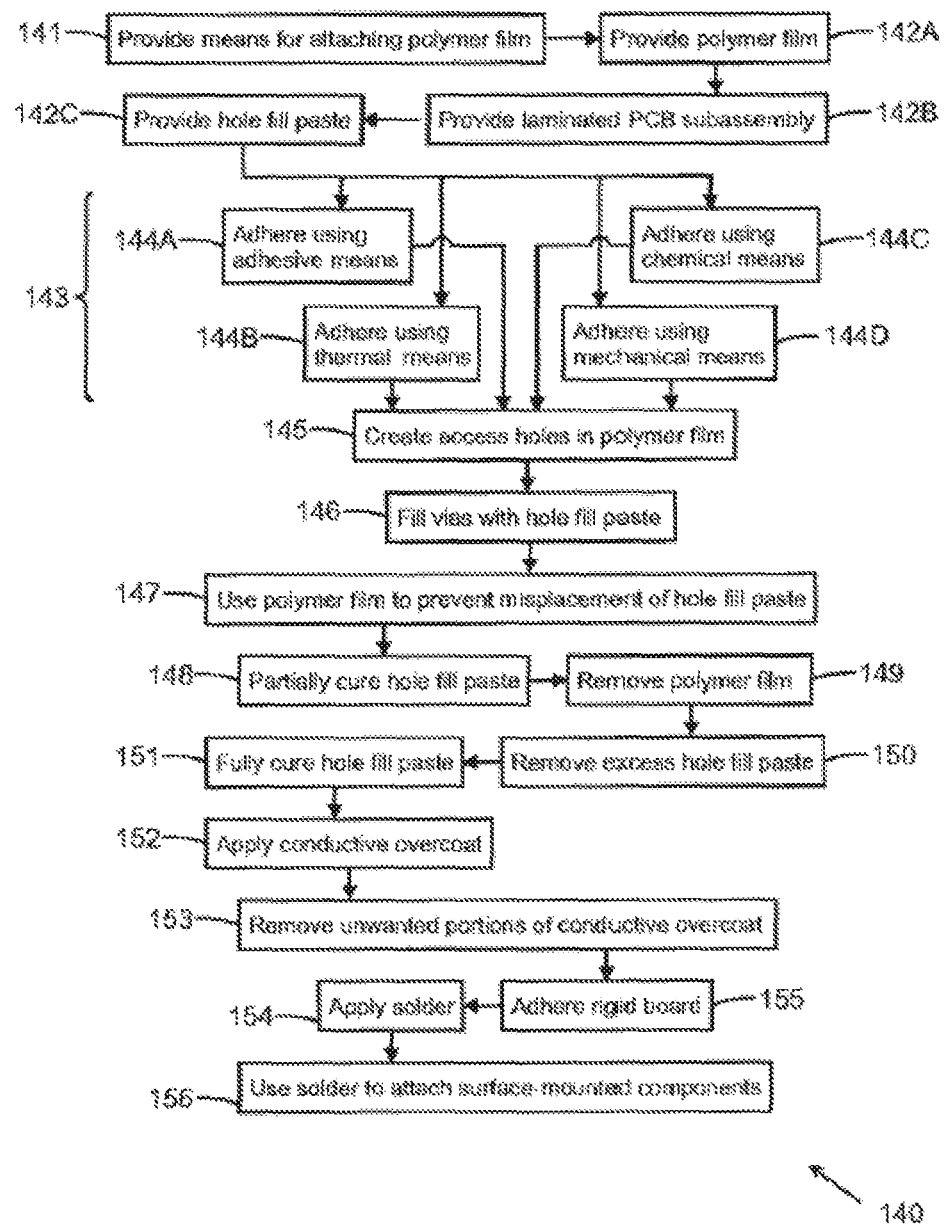
FIG. 14 is a flow diagram illustrating a further example process embodiment of the present invention.

In a further example embodiment illustrated in FIG. 14, a process for fabricating printed circuit boards 140 preferably comprises steps of providing a polymer film 142A, providing a laminated printed circuit board subassembly 142B, providing a curable hole-fill paste 142C, providing means for attaching the polymer film to the laminated printed circuit board subassembly 141, temporarily adhering the polymer film to the laminated printed circuit board subassembly 143, where the step of temporarily adhering the polymer film to the laminated printed circuit board subassembly is accomplished using at least one of: using adhesive means 144A, using thermal means 144B, using chemical means 144C, or using mechanical means 144D, cutting holes in the polymer film to expose vias 145, filling the exposed vias with the curable hole-fill paste 146, using the polymer film to prevent placement or migration of the curable hole-fill paste in unwanted areas of the laminated printed circuit board subassembly 147, partially curing the curable hole-fill paste 148, removing the polymer film 149, removing excess partially cured curable hole-fill paste 150, fully curing the curable hole-fill paste 151, applying a conductive overcoat to the laminated printed circuit board subassembly 152, removing unwanted portions of the conductive overcoat 153, applying solder to selected locations on the conductive overcoat 154, adhering a rigid board to a portion of the laminated printed circuit board subassembly 155, and using the solder to attach at least one surface-mounted component to the laminated printed circuit board subassembly 156. Note that here the item numbers refer to the steps in the process, rather than the physical components.

Alternatively, in preferred embodiments, the process illustrated in FIG. 14, may be modified by including step 155 (Adhere rigid board) earlier, such as at any point after step 142B (Provide laminated PCB subassembly). In other alternatives, the process illustrated in FIG. 14 can be modified by including a rigid board is in the PCB subassembly lamination, and so the rigid board is already included in step 142B (Provide laminated PCB subassembly). Similarly, the process illustrated in FIG. 13 can utilize a laminated PCB subassembly which includes a rigid board, or the step of adhering a rigid board can be added to the process of FIG. 13.

The present invention improves circuit board fabrication by protecting delicate structures of the circuit board, preventing hole-fill paste from damaging or interfering with portions of the circuit board, and/or providing for easier or more reliable removal of excess hole-fill paste.

The present invention is particularly valuable for combination rigid flex circuit board fabrication, where various cut-outs and flexible portions would be damaged by the hole-fill paste, and where the surface is not flat. Where there are different thicknesses, such as cut-outs or flexible portions adjacent to rigid portions, the conventional smoothing and sanding approach to processing the hole-fill paste would not achieve the desired result, but would either leave unwanted hole-fill paste in some areas, or would damage areas of the printed circuit board. The invented methods provide for easier and more reliable laminated printed circuit board fabrication.

Embodiments combining various features of the example embodiments illustrated and described can be combined to obtain other useful embodiments. Some process steps can be re-ordered to obtain still other useful embodiments. Various modifications can be made to the present invention without departing from the apparent scope thereof.

What is claimed is:

1. A process for fabricating printed circuit boards, comprising the steps of:
    providing a laminated printed circuit board subassembly having a top surface and a plurality of vias; each of the plurality of vias including a top surface opening in the top surface;
    applying a polymer film to the top surface of the laminated printed circuit board subassembly;
    creating a hole in the polymer film proximate each of a plurality of top surface openings so as to expose the top surface opening of each of the plurality of vias to facilitate access to each of the plurality of vias for a subsequent hole-fill step, wherein creating the hole in the polymer film proximate the plurality of top surface openings further comprises: using a computer numeric controlled laser to cut the polymer film in a manner directed by a computer program to expose the plurality of top surface openings; and
    filling each of the plurality of vias with hole-fill paste.

2. The process of claim 1, wherein the polymer film is an adhesive backed polymer film having an adhesive backing; and wherein the step of applying the adhesive backed polymer film to the top surface includes adhering the adhesive backing to the top surface.

3. The process of claim 1, wherein the step of applying the polymer film to the top surface further includes the step of applying an adhesive to a back surface of the polymer film such that the adhesive adheres to the back surface of the polymer film; and the step of applying the polymer film to the top surface of the laminated printed circuit board subassembly includes adhering the adhesive to the top surface.

4. The process of claim 1, wherein the hole-fill paste is a hole-fill paste that will at least partially harden when it is cured, and wherein, after filling each of the plurality of vias with hole-fill paste, the process further including the step of at least partially curing the hole-fill paste.

5. The process of claim 4, wherein, after the step of at least partially curing the hole-fill paste, the process further including the step of:
    removing the polymer film from the top surface of the laminated printed circuit board subassembly.

6. The process of claim 5, wherein the step of at least partially curing the hole-fill paste includes curing the hole-fill paste at a curing time period between two hours and four hours.

7. The process of claim 6, wherein the step of at least partially curing the hole-fill paste includes curing the hole-fill paste for a time selected from: between 1 and 48 hours, between 1 and 36 hours, between 1 and 24 hours, between 1 and 12 hours, between 1 and 6 hours, between 1 and 5 hours, between 1 and 4 hours, and between 2 and 4 hours.

8. The process of claim 6, wherein the step of at least partially curing the hole-fill paste includes curing the hole-fill paste for a time selected from: about 1 hour, about 2 hours, about 3 hours, about 4 hours, about 5 hours, about 6 hours, about 7 hours, about 8 hours, about 9 hours, about 10 hours, about 11 hours, about 12 hours, about 13 hours, about 14 hours, about 15 hours, about 16 hours, about 17 hours, about 18 hours, about 19 hours, about 20 hours, about 21 hours, about 22 hours, about 23 hours, about 24 hours, about 25 hours, about 26 hours, about 27 hours, about 28 hours, about 29 hours, about 30 hours, about 31 hours, about 32 hours, about 33 hours, about 34 hours, about 35 hours, about 36 hours, about 37 hours, about 38 hours, about 39 hours, about 40 hours, about 41 hours, about 42 hours, about 43 hours, about 44 hours, about 45 hours, about 46 hours, about 47 hours and about 48 hours.

9. The process of claim 6, wherein the step of at least partially curing the hole-fill paste includes curing the hole-fill paste at a temperature selected from: between 18° C. and 30° C., between 19° C. and 27° C., between 20° C. and 25° C., and between 21° C. and 23° C.

10. The process of claim 6, wherein the step of at least partially curing the hole-fill paste includes curing the hole-fill paste at a temperature selected from: about 18° C., about 19° C., about 20° C., about 21° C., about 22° C., about 23° C., about 24° C., about 25° C., about 26° C., about 27° C., about 28° C., about 29° C., about 30° C.

11. The process of claim 6, further comprising:
    after the step of removing the polymer film from the top surface of the laminated printed circuit board subassembly, applying a conductive overcoat to the top surface of the laminated printed circuit board.

12. The process of claim 11, further comprising:
    soldering surface-mountable electrical components to the laminated printed circuit board subassembly.

13. The process of claim 4, wherein, after the step of at least partially curing the hole-fill paste, the process further including the steps of:
    removing the polymer film from the top surface of the laminated printed circuit board subassembly; and
    further curing the hole-fill paste after the step of removing the polymer film.

14. The process of claim 1, further comprising the step of:
    removing the polymer film from the laminated printed circuit board subassembly.

15. The process of claim 1, further comprising the steps of:
    removing the polymer film from the laminated printed circuit board subassembly; and
    using a computer numeric controlled soldering system to secure surface-mountable electrical components to the laminated printed circuit board subassembly according to a computer program.

16. The process of claim 1, wherein the laminated printed circuit board subassembly further includes a bottom surface; each of the plurality of vias having a bottom surface opening in the bottom surface; and the polymer film applied to the top surface is a first polymer film;
    wherein the process further includes the steps of:
    applying a second polymer film to the bottom surface; and creating a hole in the second polymer film proximate each of a plurality of bottom surface openings in the bottom surface.

17. The process of claim 1, wherein each of the plurality of vias includes a top diameter and a bottom diameter, the top diameter being substantially equal to the bottom diameter.

18. The process of claim 1, wherein each of the plurality of vias are formed by mechanical drilling.

19. A process for fabricating printed circuit boards, comprising the steps of;
providing a laminated printed circuit board subassembly having a top surface and a plurality of vias; each of the plurality of vias including a top surface opening in the top surface;
applying a sheet of an adhesive-backed polymer film to the top surface of the laminated printed circuit board subassembly; and
creating a hole in the sheet of adhesive-backed polymer film proximate each of the plurality of top surface openings so as to facilitate access to each of the plurality of vias for a subsequent hole-fill step, wherein creating the hole in the sheet of adhesive-backed polymer film proximate the plurality of top surface openings further comprises: using a computer numeric controlled laser to cut the adhesive-backed polymer film in a manner directed by a computer program to expose the plurality of top surface openings.

20. The process of claim 19, wherein the adhesive-backed polymer film is a polyolefin film having an adhesive backing.

21. The process of claim 19, further comprising the step of: filling each of the plurality of vias with hole-fill paste.

22. The process of claim 20, wherein a significant component of the adhesive backing is rubber.

23. The process of claim 21, further comprising the step of:
removing the adhesive-backed polymer film from the laminated printed circuit board subassembly.

24. The process of claim 21, wherein the hole-fill paste is a hole-fill paste that will at least partially harden when it is cured, and wherein, after filling each of the plurality of vias with hole-fill paste, the process further includes the step of at least partially curing the hole-fill paste.

25. The process of claim 24, wherein, after the step of at least partially curing the hole-fill paste, the process further includes; the step of:
removing the adhesive-backed polymer film from the top surface of the laminated printed circuit board subassembly.

26. The process of claim 24, wherein, after the step of at least partially curing the hole-fill paste, the process further includes the steps of:
removing the adhesive-backed polymer film from the top surface of the laminated printed circuit board subassembly; and
further curing the hole-fill paste after the step of removing the polymer film.

27. The process of claim 21, further comprising the steps of:
removing the polymer film from the laminated printed circuit board subassembly;
and using a computer numeric controlled soldering system to secure surface-mountable electrical components to the laminated printed circuit board subassembly according to a computer program.

28. The process of claim 19, wherein the laminated printed circuit board subassembly has a bottom surface; each of the plurality of vias includes an opening in the top surface and an opening in the bottom surface and the sheet of adhesive-backed polymer film is a first sheet of the adhesive-backed polymer film; and wherein the process further includes the steps of:
applying a second sheet of adhesive-backed polymer film to the bottom surface; and
creating a hole in the second sheet of adhesive-backed polymer film proximate each of a plurality of bottom surface openings in the bottom surface.

29. A process for fabricating printed circuit boards, comprising the steps of:
providing a laminated printed circuit board subassembly having a top surface and a plurality of vias, each of the plurality of vias including a top surface opening in the top surface;
applying a polymer film to a top surface of the laminated printed circuit board subassembly;
creating holes in the polymer film proximate each of the plurality of vias so as to make the vias accessible;
filling each of the plurality of vias with a curable hole-fill paste;
at least partially curing the curable hole-fill paste;
removing the polymer film from the laminated printed circuit board subassembly; and
soldering surface-mountable electrical components to the laminated printed circuit board subassembly, wherein creating the holes in the polymer film proximate each of the plurality of vias further comprises: using a computer numeric controlled laser to cut the polymer film in a manner directed by a computer program to expose the plurality of top surface openings.

30. The process of claim 29, after the step of removing the polymer film, the process further comprising the step of securing a rigid board to a portion of the laminated printed circuit board subassembly.

31. The process of claim 29, wherein the laminated printed circuit board subassembly has a top surface and a bottom surface, and wherein the polymer film is applied to both the top surface and the bottom surface of the laminated printed circuit board subassembly, and wherein holes are created in the polymer film applied to both the top surface and the bottom surface of the laminated printed circuit board subassembly proximate the plurality of vias so as to expose the plurality of vias.

32. A process for fabricating printed circuit boards, comprising the steps of:
providing a laminated printed circuit board subassembly having a top surface, a bottom surface and a plurality of vias; each of the plurality of vias including a top surface opening in the top surface and a bottom surface opening in the bottom surface;
applying a first sheet of polymer film to the top surface of the laminated printed circuit board subassembly and a second sheet of polymer film to the bottom surface of the laminated printed circuit board subassembly; and
creating a plurality of holes in each of the respective sheets of polymer film, each of which is proximate one of the plurality of top surface openings or the plurality of bottom surface openings, respectively, so as to expose each of the respective openings to facilitate a subsequent step of filling each of the vias with hole-fill paste, wherein creating the plurality of holes in each of the respective sheets of polymer film proximate the plurality of openings in the top surface and the bottom surface, respectively, further comprises: using a computer numeric controlled laser to cut the polymer film in a manner directed by a computer program to expose the plurality of top and bottom surface openings.

* * * * *